United States Patent
Takahashi

(10) Patent No.: US 6,850,449 B2
(45) Date of Patent: Feb. 1, 2005

(54) SEMICONDUCTOR MEMORY DEVICE HAVING MODE STORING ONE BIT DATA IN TWO MEMORY CELLS AND METHOD OF CONTROLLING SAME

(75) Inventor: Hiroyuki Takahashi, Kanagawa (JP)

(73) Assignee: NEC Electronics Corp., Kanagawa (JP)

( * ) Notice: Subject to any disclaimer, the term of this patent is extended or adjusted under 35 U.S.C. 154(b) by 0 days.

(21) Appl. No.: 10/683,818

(22) Filed: Oct. 10, 2003

(65) Prior Publication Data

US 2004/0076054 A1 Apr. 22, 2004

(30) Foreign Application Priority Data

Oct. 11, 2002 (JP) ....................................... 2002-299025

(51) Int. Cl.[7] ............................................... G11C 7/00
(52) U.S. Cl. ........................ 365/222; 365/205; 365/194
(58) Field of Search ............................... 365/222, 205, 365/194, 149

(56) References Cited

U.S. PATENT DOCUMENTS

| | | | | |
|---|---|---|---|---|
| 5,138,578 A | * | 8/1992 | Fujii | 365/149 |
| 6,084,811 A | * | 7/2000 | Dorney | 365/205 |
| 6,449,204 B1 | * | 9/2002 | Arimoto et al. | 365/222 |

FOREIGN PATENT DOCUMENTS

| | | |
|---|---|---|
| JP | 2000-57763 | 2/2000 |
| JP | 2001-143463 | 5/2001 |
| JP | 2001-307479 | 11/2001 |
| JP | 2002-74944 | 3/2002 |
| JP | 2002-170386 | 6/2002 |

* cited by examiner

Primary Examiner—Huan Hoang
(74) Attorney, Agent, or Firm—Choate, Hall & Stewart

(57) ABSTRACT

A device has a bit line pair including first and second bit lines, a sense amplifier commonly connected to the bit line pair, and first and second cells connected at intersecting portions of first and second word lines and the first and second bit lines. In a normal mode, the first and second word lines are assigned separate addresses, whereas in a partial mode, the first and second word lines are assigned the same address. The first and second cells complimentarily store one bit of data. In storing a data in a first cell of two cells comprised in a twin cell into a second cell when set to the partial mode, the second word line is activated based on a trigger signal generated by a refresh timer during a precharge period for the bit line pair, and subsequently the precharge is completed. The first word line is then activated based on a delayed signal of the trigger signal, and the sense amplifier is activated to amplify a differential voltage between the bit line pair, so that the data of the first cell is written back into the first and second cells.

21 Claims, 11 Drawing Sheets

SEMICONDUCTOR MEMORY DEVICE HAVING MODE STORING ONE BIT DATA IN TWO MEMORY CELLS AND METHOD OF CONTROLLING SAME

BACKGROUND OF THE INVENTION

1. Field of the Invention

The present invention relates to a semiconductor memory device and a method of controlling the same, and more particularly to a refresh control for a semiconductor memory device having a mode in which one bit of data is stored by two memory cells.

2. Description of Related Art

It is proposed a method that retains one bit data by using twin memory cell. FIG. 14 is a diagram for explaining such a method. Referring to FIG. 14, a cell array 11 a bit line pair comprising first and second bit lines B and /B which are commonly connected to a sense amplifier (SA) 12, and is provided with a first memory cell MC1 which is connected to a first word line WL1 and the first bit line B, and a second memory cell MC2 which is connected to a second word line WL2 and the second bit line /B. In a normal mode (normal operation) of one bit-one cell, the first and second word lines WL1 and WL2 which are respectively driven by first and second word drivers WD1 and WD2, are assigned separate addresses, and different data are written into the first and second memory cells and read out separately. One the other hand, in a partial mode (also referred to as a "twin cell mode") such as in a stand-by state or the like, in which low power consumption is achieved, the first and second word lines WL1 and WL2 are assigned the same address and are driven by the first and second word drivers WD1 and WD2 at a high voltage with the same timing. At the time of entering the partial mode switched from the normal mode, the data in the first memory cell MC1, for example, is copied and saved into the second memory cell MC2, whereby the one-bit information is stored into two memory cells complimentarily. With such a configuration, hold characteristics of dynamic type cells improve, and it is made possible to remarkably lengthen the interval of the refresh operation, which is performed periodically, in comparison with the case of one bit/one cell. As a consequence, current consumption resulting from the refresh operation is reduced, and reduction in current consumption is achieved during a stand-by state.

Recently, a semiconductor memory device known as "pseudo SRAM" has been developed that has the same specifications as SRAM (static random access memory) when observed from outside, though it uses the same memory cells as those employed in DRAM. Having both advantages of SRAM and DRAM, it is recognized as suitable for portable devices or the like. Unlike DRAM, the pseudo SRAM does not need to be provided with row addresses and column addresses separately, and for this reason, it does not require timing signals such as RAS and CAS. As in general-purpose SRAMs, it is sufficient for the pseudo SRAM to be provided with addresses at one time, and it performs read/write operations by fetching addresses inside using a chip enable signal, which corresponds to clock in clock synchronous type semiconductor memory devices, as a trigger. In addition, it has been known that an asynchronous pseudo SRAM that does not require external refresh control so that it can operate with completely the same specifications as those of general-purpose SRAMs, suffers from such problems that normal access is affected by refresh operations and that refresh operations become impossible by continuous write operations. With an aim of resolving these problems, the inventors of the present application have already proposed a semiconductor memory device in which after refreshing a memory cell corresponding to a refresh address signal in response to an address change-detecting signal generated in response to an input address signal, the memory cell corresponding to the input address signal is accessed (for example, see Patent Document 1 listed below). In pseudo SRAMs, the refresh time is set in an internal between normal operations, and the pulse widths necessary for the refresh operation cannot be widened. This is because it leads to degradations in access time and cycle characteristics. Also, even in DRAMs compatible with asynchronous SRAMs in which read/write operations are performed after refreshing as described in the above-mentioned Patent Document 1, it is undesirable to widen the refresh operations since it causes degradation in access time. Moreover, in terms of performance specifications, it is difficult to widen the time for the refresh operations in a cell array of high-speed synchronous SRAM that is to be incorporated in portable terminals and switching functions and routing functions for networks.

In the twin cell DRAM shown in FIG. 14, at the switching from the normal mode to the partial mode, when data in the first memory cell are saved in the second memory cell, the data in the two memory cells may collide with each other and be damaged if the first and second word lines WL1 and WL2 are selected at the same time as shown in FIG. 15A. Specifically, referring to FIG. 14, in the partial mode, the first memory cell MC1 and the second memory cell MC2 that together form a twin cell store one bit of data complimentarily. In the case where both the first and second memory cells store data HIGH in the normal mode, if the first and second word lines WL1 and WL2 are simultaneously selected at the time of switching to the partial mode in order to read out the cell data in the first memory cell MC1 and write it into the second memory cell MC2, both the first and second memory cells drive the complementary bit line pair B, /B with voltage HIGH; therefore, the differential voltage between the bit line pair B, /B does not widen. Consequently, if the differential voltage between the bit line pair is differential amplified by the sense amplifier 12 and rewritten into the first and second memory cells, the data of the first and second memory cells are destroyed.

In addition, the refresh period extends if the configuration is adopted in which, as shown in FIG. 15B, the first word line WL1 is selected (pulse width t0 is equal to the pulse width of the word line in the normal mode) to restore (write back) the first memory cell MC1 by the sense amplifier 12's reading and thereafter the second word line WL2 is selected to write the cell data of the first memory cell MC1 into the second memory cell MC2. Specifically, read/write (READ/WRITE) access is suspended until the refresh operation ends. When a memory that is compliant to SRAM interface such as the above-described pseudo SRAM or the like does not have an external terminal for exchanging a refresh control signal with an external controller, it is necessary to carry out timing design in advance so that READ/WRITE operations are performed after the refresh operation finishes, and consequently, access time increases.

It is also known that there is a semiconductor memory device that switches from a state wherein data are held with one bit/one cell in a normal mode to a twin cell mode wherein information is held with one bit/two cells, and in the twin cell mode, two sub-word lines are simultaneously brought into a selected state to read out stored data in the memory cell with bit lines that form a pair and to perform a sense operation (for example, see Patent Document 2 listed below). In Patent Document 2 (FIG. 10), for example, as shown in FIG. 16 appended to the present application, a sub-word line SWLL<0> is driven (activated) to a selected state and a data of the cell connected to the sub-word line SWLL<0> is read out on the corresponding bit line (in FIG. 16, a HIGH level data is read out), but, because the other bit line is not connected to the memory cell, its read voltage ΔV2=0 and the precharge voltage level is maintained. Subsequently, sense amplifier-activating signals SON and ZSOP (corresponding to the sense enable signal SE in FIG. 14) are activated, so that a data stored in one memory cell is detected and amplified by a sense amplifier and is latched. After the sense operation is completed and the bit line potential is driven to an array power supply voltage VCCS and a ground voltage level, a sub-word line SWLR<1>, which is the other one of the pair, is driven to a selected state. The memory cell connected to the sub-word line SWLR<1> stores the data that has been amplified by the sense amplifier and latched. In other words, a cell 1 and a cell 2, which are connected to the sub-word lines SWLL<0> and SWLR<1>, store complimentary data. After a predetermined time has elapsed, the sub-word lines SWLL<0> and SWLR<1> are driven to a non-selected state and the sense amplifier-activating signals SON and ZSOP are inactivated, whereby the data in the cell 1 is moved to the cell 2, thus completing a data write operation to a unit cell in the twin cell mode. The cell data write operation is similar to the method shown in FIG. 15B.

Also known as a semiconductor memory device having one bit/one cell and one bit/two cells modes is, for example, a configuration in which two cells are connected to the same bit line (for example, see Patent Document 3 below). Also known is a semiconductor memory device in which data in two cells in a twin cell mode have a complementary relationship, the two cells are connected to the same word line, and switching to one bit/one data is not performed (for example, see Patent Document 4 below).

With regard to a configuration in which an intermediate voltage is written into a dynamic type memory cell, which will be described in Detailed Description of the Preferred Embodiments hereinbelow, also further known is a configuration that adopts a system in which a bit line pair is precharged to ½VBLH to activate a dummy word line so that ½VBLH is written into a dummy cell having the same structure and capacity as those of normal memory cells (for example, see Patent Document 5 below)

[Patent Document 1]
Japanese Unexamined Patent Publication No. 2002-74944 (see p. 8 and FIG. 1).
[Patent Document 2]
Japanese Unexamined Patent Publication No. 2002-170386 (see p. 20 and FIG. 10).
[Patent Document 3]
Japanese Unexamined Patent Publication No. 2000-057763 (see p. 4 and FIG. 4).
[Patent Document 4]
Japanese Unexamined Patent Publication No. 2001-143463 (see pp. 3–4 and FIG. 1).
[Patent Document 5]
Japanese Unexamined Patent Publication No. 2001-307479 (see p. 4 and FIG. 10).

SUMMARY OF THE INVENTION

Accordingly, it is an object of the present invention to provide a semiconductor memory device and a method of controlling the same that achieve reduction in a data copy duration in the twin cell and suppress an increase in access time due to the refresh operation.

It is another object of the present invention to provide a semiconductor memory device that makes it possible to write data properly for the twin cell at the time of shifting to the partial mode, and a method of controlling the same. It is further another object of the present invention to provide a semiconductor memory device wherein read/write is possible within a predetermined access time even when switched from a normal mode to a stand-by mode and suddenly received a read/write request while switching to a partial mode, and a method of controlling the same.

In order to accomplish the foregoing and other objects, the present invention provides, in accordance with one aspect, a semiconductor memory device that stores and holds one bit of data complementarily by two memory cells respectively connected to two bit lines (also referred to as a "bit line pair") commonly connected to one sense amplifier, in which, prior to copying a cell data of one of the two memory cells into the other one of the memory cells, a cell data of the other one of the memory cells is reset; and after resetting the other one of the memory cells, a word line connected to the one of the memory cells is activated, the data of the one of the memory cells to be output to the bit line pair is amplified by the sense amplifier, and the cell data of the one of the memory cells is stored into the other one of the memory cells from the sense amplifier via the bit line pair. In the present invention, the cell data of the other one of the memory cells is reset by activating the word line connected to the other one of the memory cells in a period in which the bit line pair is precharged to a precharge voltage having an intermediate voltage value between high-potential side and low-potential side power supply voltages, and writing the intermediate voltage into the other one of the memory cells. In the present invention, the two memory cells are respectively connected to two word lines; in a normal mode, the two word lines are assigned separate addresses; and the device is controlled so that, in a twin cell mode in which one bit of data is complimentarily stored and held by the two memory cells, the two word lines are assigned the same address and are activated at the same time after a cell data of one of the two memory cells is copied into the other one of the memory cells. In the present invention, the copy of a data of one of the two memory cells into the other one of the memory cells is performed based on a trigger signal for instructing a refresh operation of the memory cells.

In accordance with another aspect, the present invention provides a semiconductor memory device comprising: a cell array having a plurality of memory cells, the cell array including at least; a bit line pair comprising first and second bit lines commonly connected to one sense amplifier; a first memory cell including a first memory cell transistor and a first capacitor element, the first memory cell transistor having a gate connected to a first word line, and a drain and source, one of which is connected to the first bit line, and the first capacitor element connected to the other one of the drain and source of the first memory cell transistor; and a second memory cell including a second memory cell transistor and a second capacitor element, the second memory cell transistor having a gate connected to the second word line, and a drain and source, one of which is connected to the second bit line, the second capacitor element connected to the other one of the drain and source of the second memory cell transistor; wherein, in a normal mode, the first and second word lines are assigned separate addresses from each other, and write and read operations for data are performed in the first and second memory cells separately; whereas in a partial mode, the first and second word lines are assigned the same address, and the first and second memory cells form a twin cell that complimentarily stores and holds one bit of data by two cells; wherein, in storing, among the first and second memory cells comprised in the twin cell, a cell data of the first memory cell, which is a copy source, into the second memory cell, which is a copy destination, when switched from the normal mode to the partial mode based on a control signal for controlling mode switching; the second word line is activated based on a trigger signal generated by a refresh timer regulating an interval of a self-refresh operation in a precharge period for the bit line pair comprising the first and second bit lines, so that a precharge voltage is written into the second memory cell; subsequently, precharge of the bit line pair is completed, and the first word line is activated; and thereafter, the sense amplifier is activated to amplify a differential voltage between the bit line pair, and the cell data of the first memory cell is written back in to the first and second memory cells. In the present invention, a cycle period of the trigger signal is made the same as a cycle period of the trigger signal in the normal mode during one refresh period, which is a period until, after entering the partial mode, a refresh operation for copying a cell data of the first memory cell comprised in the twin cell into the second memory cell, is cycled at least one time for the memory cells in the cell array; and after the one refresh period in the partial mode, the cycle period of the trigger signal is longer than the cycle period of the trigger signal in the normal mode. As will be appreciated from the description hereinbelow, the foregoing objects are also accomplished by the invention as set forth in the appended claims.

DETAILED DESCRIPTION OF THE INVENTION

Figure 3:
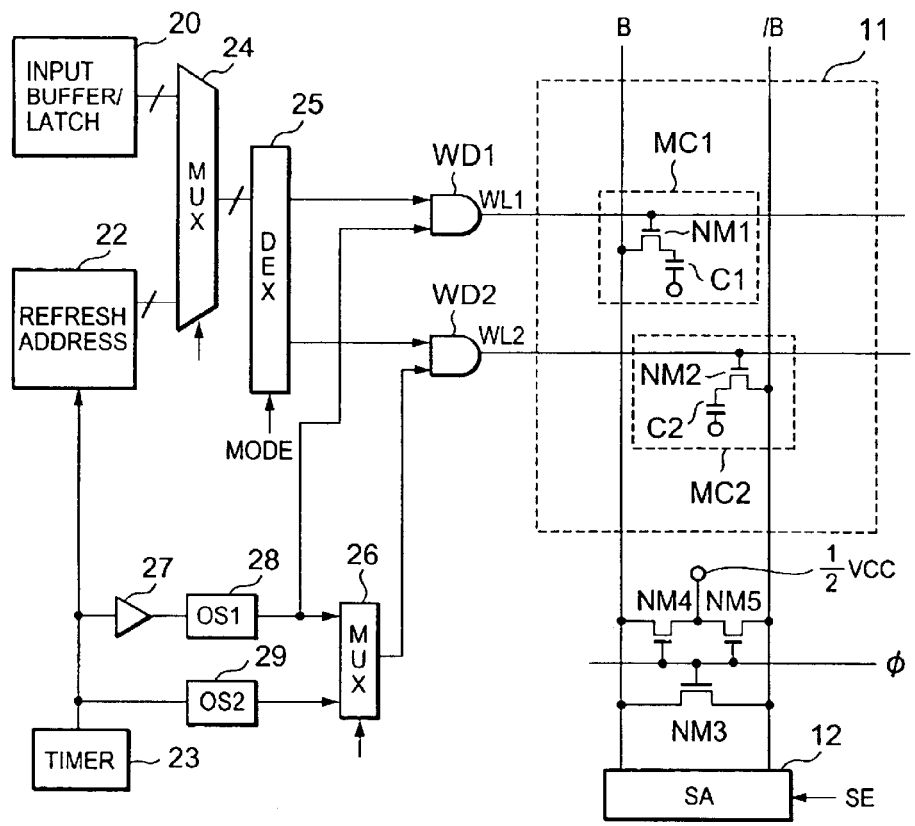
FIG. 3 is a diagram for illustrating the configuration of the first example of the present invention.

Preferred embodiments of the present invention are described below. Referring to FIG. 3, in one preferred embodiment, a semiconductor memory device according to the present invention comprises: a cell array (11) having a plurality of memory cells, the cell array including at least; a bit line pair comprising first and second bit lines (B, /B) commonly connected to a sense amplifier (SA); a first memory cell (MC1) including a memory cell transistor (NM1), the gate of which is connected to a first word line (WL1) and one of the drain and source of which is connected to the first bit line (B), and a capacitor element (C1) connected to the other one of the drain and source of the memory cell transistor (MC1); and a second memory cell (MC2) including a memory cell transistor (NM2), the gate of which is connected to a second word line (WL2) and one of the drain and source of which is connected to the second bit line (/B), and a capacitor element (C2) connected to the other one of the drain and source of the memory cell transistor (NM2) In a normal mode, the first and second word lines (WL1, WL2) are assigned separate addresses, and the first and second memory cells (MC1, MC2) are written with different data and are read separately, whereas in a partial mode (twin cell mode), the first and second word lines (WL1, WL2) are assigned the same address and one bit of data is stored complimentarily in the first and second memory cells.

In the present embodiment, in storing a cell data of the first memory cell (MC1) into the second memory cell (MC2), the second word line (WL2) is activated based on a trigger signal generated by a refresh timer (denoted by reference numeral 23 in FIG. 3) for controlling an interval of a self-refresh operation in a precharge period for a bit line pair comprising the first and second bit lines (B, /B); subsequently, precharge is completed, and the first word line (WL1) is activated based on a delayed signal of the foregoing trigger signal; and thereafter, the sense amplifier (SA) is activated to amplify a differential voltage between the bit line pair, and the cell data of the first memory cell (MC1) is written back into the first and second memory cells (MC1, MC2) from the sense amplifier (SA) through the bit line pair.

In the present embodiment, the semiconductor memory device may further comprise: a delay circuit (denoted by reference numeral 27 in FIG. 3) for delaying a trigger signal; a first pulse generating circuit (28) for generating a one-shot pulse based on the trigger signal delayed by the delay circuit; a second pulse-generating circuit (29) for generating a one-shot pulse based on the trigger signal from the refresh timer (23); wherein an output signal from the first pulse generating circuit (28) is input to a first word driver WD1 for driving the first word line WL1; and further comprises a selector circuit (26) for receiving as input the output signal from the first pulse generating circuit (28) and the output signal from the second pulse generating circuit (29) and selecting one of them; wherein an output signal from the selector circuit (26) is input to a second word driver (WD2) for driving the second word line. The selector circuit (26) maybe configured such that during a period until a refresh operation for copying a cell data of the first memory cell comprised in the twin cell into the second memory cell is cycled at least one time after entering the partial mode (the period is herein referred to as "one refresh period"), the selector circuit supplies the output signal from the second pulse generating circuit (29) to the second word driver (WD2), whereas, after the one refresh period, the selector circuit supplies the output signal from the first pulse generating circuit (28) to the second word driver (WD2).

In the present embodiment, a cycle period of the trigger signal generated by a refresh timer is made the same as the cycle period in the normal mode (a short cycle period) during a period until a refresh operation for copying a cell data of the first memory cell comprised in the twin cell into the second memory cell, is cycled at least one time for the memory cells in the cell array after entering the partial mode (the period is herein referred to as one refresh period), and after the one refresh period, a signal obtained by frequency-dividing the signal generated by the refresh timer is used as the trigger signal so that the cycle period of the trigger signal is made longer (a long cycle period) than the cycle period of the trigger signal in the normal mode (the short cycle period).

Figure 5:
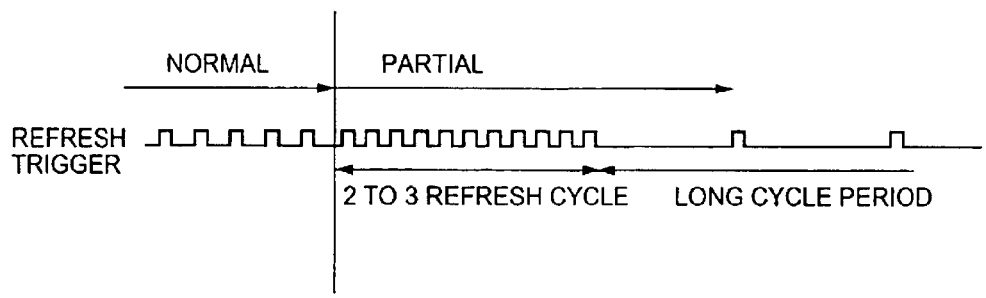
FIG. 5 is a chart showing a timing waveform of a refresh trigger signal in a second example of the present invention.
Figure 6:
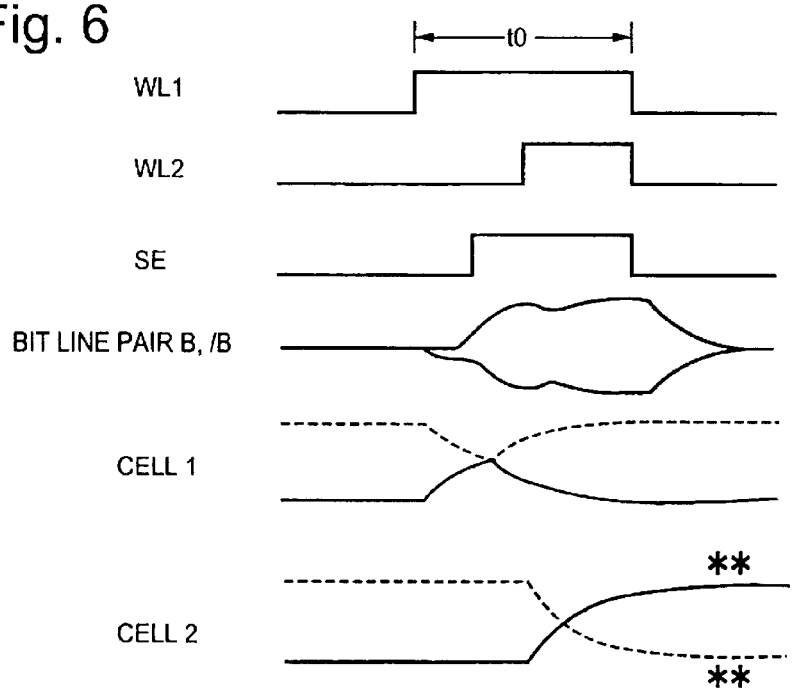
FIG. 6 is a timing chart for illustrating the operation of the second example of the present invention.

In another embodiment, a semiconductor memory device according to the present invention is provided in which, referring to FIG. 6, in storing, among the first and second memory cells comprised in the twin cell, a cell data of the first memory cell (MC1), which is a copy source, into the second memory cell (MC2), which is a copy destination, when switched from the normal mode to the partial mode based on a control signal for controlling mode switching, the first word line (WL1) is activated based on a trigger signal generated by a refresh timer regulating an interval of a self-refresh operation after completion of precharge of the bit line pair comprising the first and second bit lines, subsequently a sense amplifier-activating signal (sense enable) (SE) is activated to activate the sense amplifier (SA), and the activated sense amplifier (SA) amplifies the cell data of the first memory cell (MC1) that appears on the bit line pair; and subsequently, while the first word line (WL1) and the sense amplifier (SA) are being activated, the second word line (WL2) is activated, whereby the cell data of the first memory cell (MC1) is written back into the second memory cell (MC2) In this embodiment, the cycle period of the trigger signal generated by the refresh timer is made the same as or a shorter than the cycle period in the normal mode during a period until the refresh operation for copying a cell data of the first memory cell comprised in the twin cell into the second memory cell being cycled a predetermined number of times (for example, two or three times) for the memory cells in the cell array after entering the partial mode, and thereafter, the cycle period of the trigger signal generated by the refresh timer is made a longer cycle period than the period in the normal mode (see FIG. 5).

Figure 8:
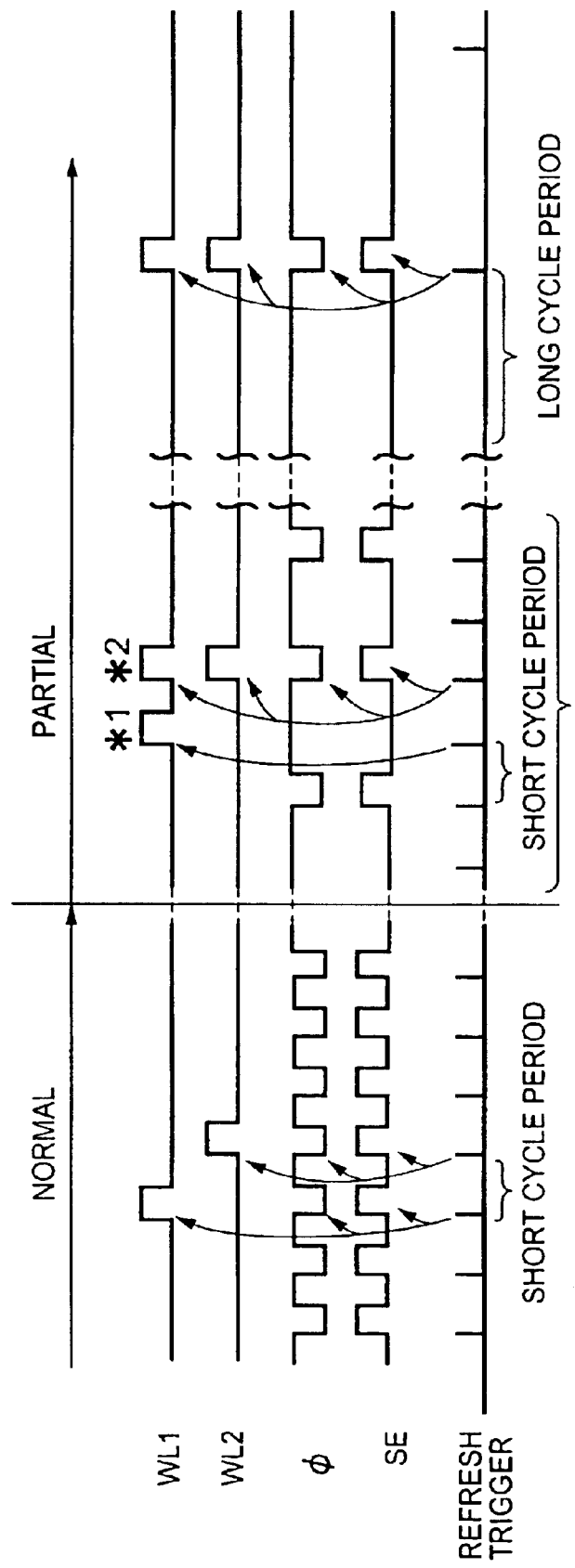
FIG. 8 is a timing chart for illustrating the third example of the present invention.

In another embodiment, a semiconductor memory device according to the present invention is provided in which: referring to FIG. 8, in storing, among the first and second memory cells comprised in the twin cell, a cell data of the second memory cell (MC2), which is a copy source, into the first memory cell (MC1), which is a copy destination, when switched from the normal mode to the partial mode; the first word line (WL1) is first activated based on a trigger signal generated by a refresh timer regulating an interval of a self-refresh operation, to write a precharge voltage into the first memory cell (MC1) in a precharge period for the bit line pair comprising the first and second bit lines; and subsequently, based on a next cycle's trigger signal, the precharge for the bit line pair is completed, the first and second Word lines (WL1, WL2) are activated, and further, the sense amplifier-activating signal (SE) is activated to activate the sense amplifier (SA), whereby the sense amplifier (SA) amplifies the cell data of the first memory cell (MC1) that appears on the bit line pair (B, /B) so that the cell data of the first memory cell is written back into the first and second memory cells.

In further another embodiment, a semiconductor memory device according to the present invention is provided in which: referring now to FIG. 9, in storing a data in the first memory cell (MC1) among two memory cells comprised in the twin cell into the second memory cell (MC2) when set from the normal mode to the partial mode; the first word line (Word1) is activated based on a trigger signal generated by a refresh timer for controlling an interval of a self-refresh operation, and the sense amplifier (SA) is activated; and while the first word line (Word1) is being in an activated state, the second word line (Word2) is successively activated, so that the data of the first memory cell (MC1) is written back into the first and second memory cells; the first word line (Word1) is kept in an activated state for a longer period (about two times longer) than in the normal mode, the second word line (Word2) is kept in an activated state for the same period as in the normal mode. Because the activation period for the first word line (Word1) becomes long, the refresh operation is interrupted if a read/write access occurs during this period.

Figure 9A:
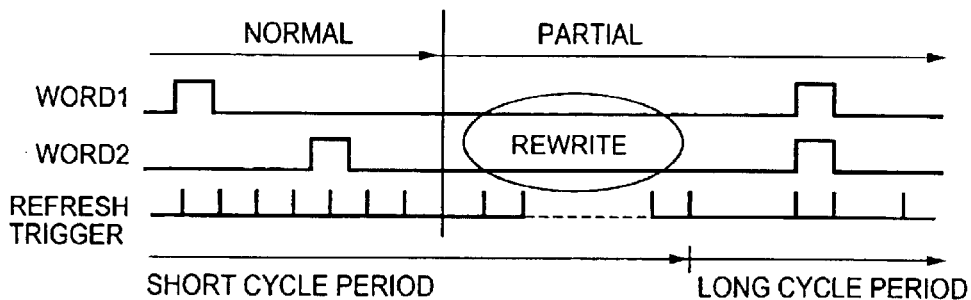
FIG. 9A is a timing chart for illustrating a fourth example of the present invention.
Figure 9B:
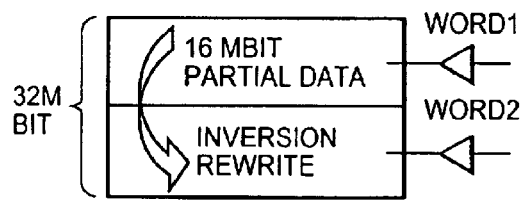
FIG. 9B is a schematic view showing a switching operation to the partial mode.
Figure 9C:
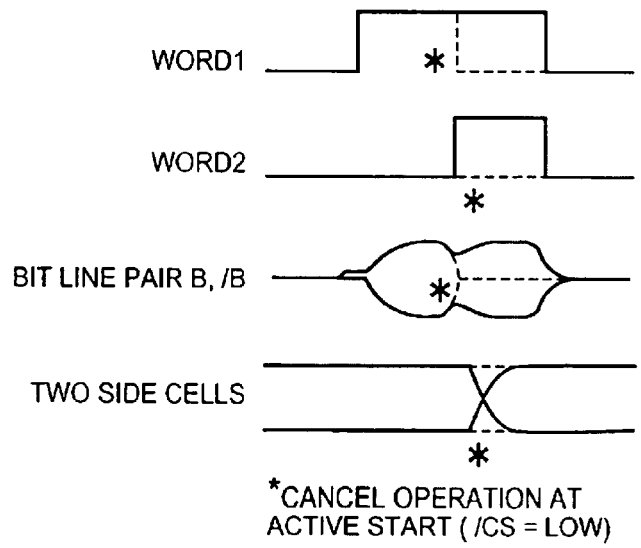
FIG. 9C is a timing waveform chart showing an example of a control operation when a chip select signal is activated.

In addition, in the present embodiment, if a read/write access occurs at a time after the trigger signal is output and the first word line (Word1) is activated but before the second word line (Word2) is activated, (for example, if a chip select signal is activated), the first word line (Word1) is activated for the same period as in the normal mode and is thereafter inactivated (see, for example, the dashed line for signal Word1 in FIG. 9(C) indicated by asterisk "*"), and activation of the second word line (Word1) is interrupted (see, for example, the dashed line for signal Word2 in FIG. 9(C), indicated by asterisk "*"), so that a read/write operation is performed for the memory cells on the selected word line.

Figure 10A:
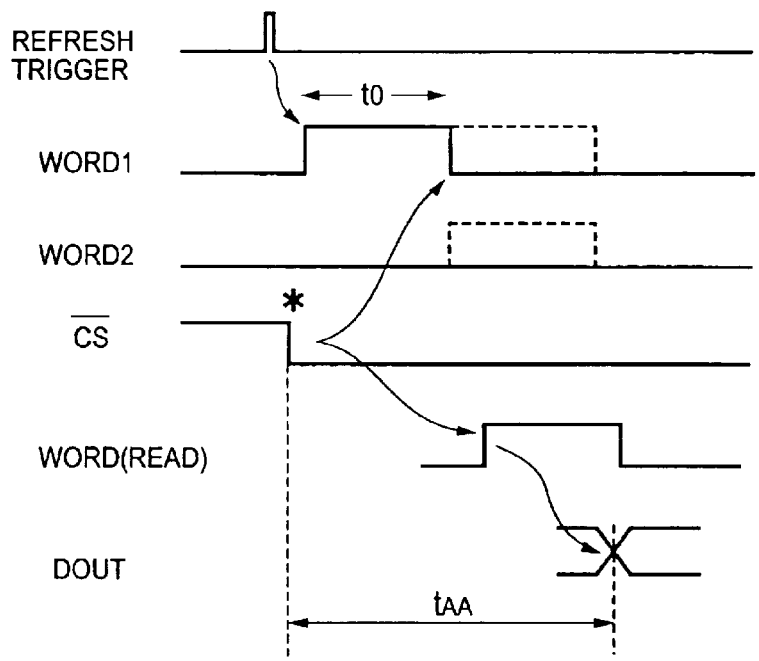
FIG. 10A is a timing chart for illustrating the fourth example of the present invention, which is a timing waveform chart showing an example of a control operation when the chip select signal becomes active before a word line WL1 is activated and a word line WL2 is activated in cases of performing a cell data copy by refresh.
Figure 10B:
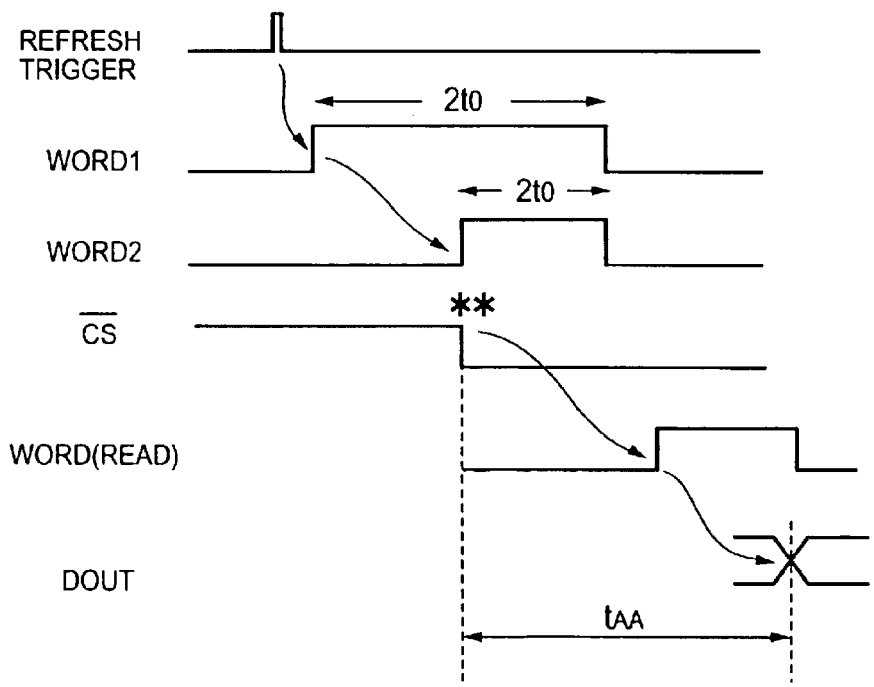
FIG. 10B is a timing waveform chart showing an example of a control operation when the chip select signal becomes active while the word line WL2 is being activated.

In the present embodiment, as shown in FIG. 10(B), based on a trigger signal for refresh, if a read/write access occurs (for example, if a chip select signal is activated) while the first word line (Word1) is being activated and after the second word line (Word2) is activated, the first word line (Word1) is activated for a longer period, for example, for a period two times longer (2t0), than in the normal mode and the second word line (Word1) is activated for the same period (t0) as in the normal mode to perform rewriting, and thereafter a read/write operation is performed for the memory cells on the selected word line.

In the above-described embodiment of the present invention, during a precharge period for the bit line pair, the bit line pair is precharged to an intermediate voltage of ½VCC that is between a high-potential side power supply voltage VCC and a low-potential side power supply voltage GND, and the memory cell on the side of the word line that has been activated (for example, activation of the second word line) during the precharge period is written with the intermediate voltage to reset the cell data. After a copy operation of a cell data of one of the two memory cells comprised in the twin cell into the other one of the memory cells is cycled at least one time for all the memory cells that form twin cells in the cell array based on the refresh trigger signal, the refresh trigger signal is made to have a long cycle period and the first and second word lines connected to the respective two memory cells forming a twin cell are activated at the same time.

Figure 12:
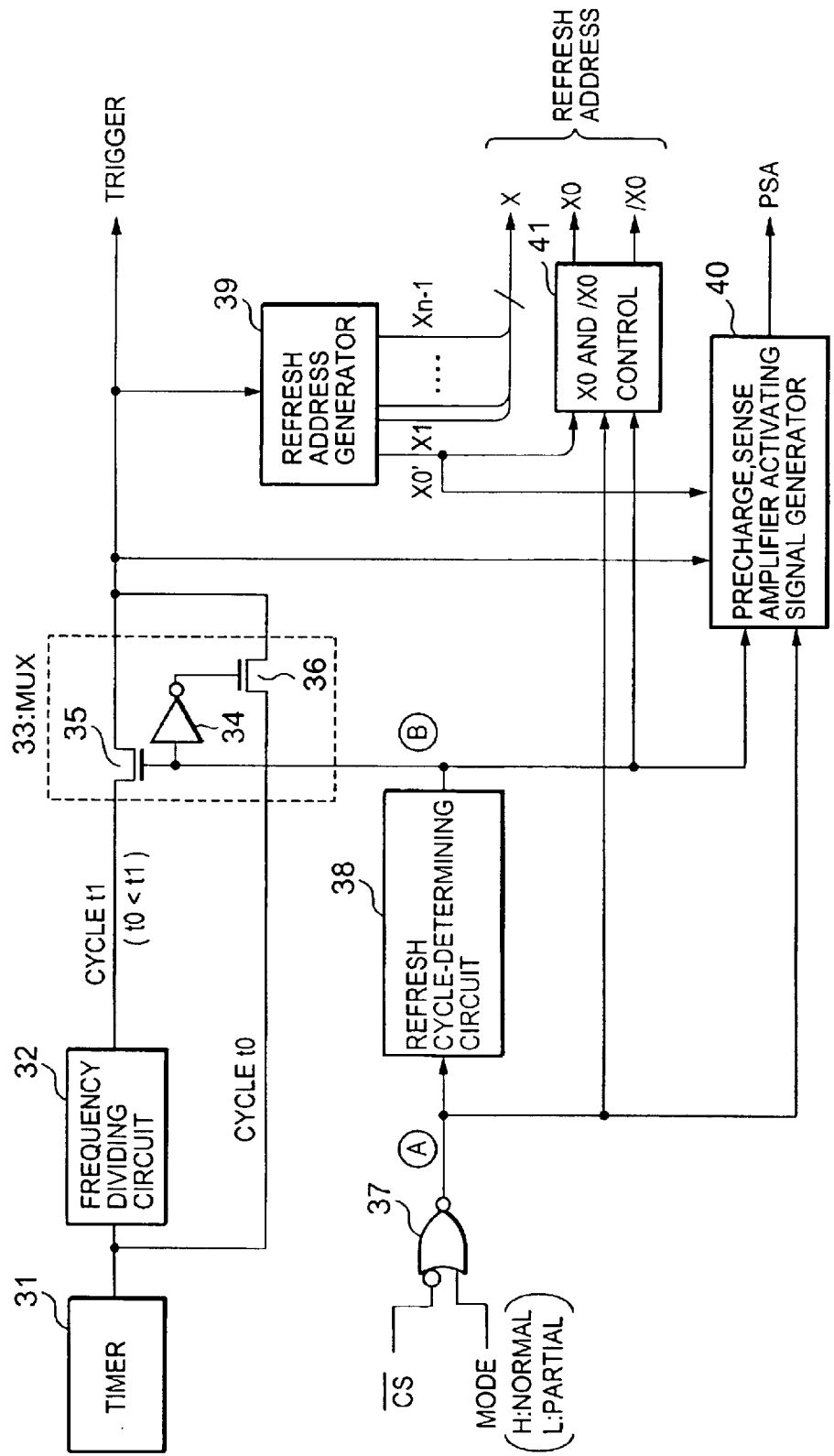
FIG. 12 is a diagram showing the configuration of a control circuit for generating a PSA signal in FIG. 11.

In one embodiment of the present invention, referring to FIG. 12, the following are provided as a means for switching the trigger signal for refresh between a normal cycle period and a long cycle period: a refresh timer (31) that outputs an overflow signal at counting up as a trigger signal; a frequency dividing circuit (32) that frequency-divides the trigger signal from the refresh timer (31); a logic gate (37) performing a logical operation between a chip select signal (/CS) and a mode signal (MODE) for controlling switching between the normal mode and the partial mode; a refresh cycle period-determining circuit (38) for determining, based on an output from the logic gate (37), the cycle period of the trigger signal as the same short cycle period as that in the normal mode when being in the partial mode and the chip select signal being in an inactivated state, and thereafter switching the cycle period of the trigger signal to a long cycle period; and a selector circuit (33) for selecting and outputting as the trigger signal one of an output signal from the refresh timer (31) and a frequency division signal from the frequency dividing circuit (32) based on the result of decision in the refresh cycle period-determining circuit (38).

In one embodiment of the present invention, the following are also provided: a circuit (denoted by reference numeral 40 in FIG. 12) for generating a signal for controlling precharge of the bit line pair in the cell array and activation of the sense amplifier (SA) based on the trigger signal output from the selector circuit (reference numeral 33 in FIG. 12), an output signal from the refresh cycle period-determining circuit (reference numeral 38 in FIG. 12), an output signal from the logic gate (reference numeral 37 in FIG. 12), and the least significant bit signal of a refresh address; a pulse generator (denoted by reference numeral 30 in FIG. 11) for generating a one-shot pulse ("core activating pulse") for controlling activation of the cell array based on change of an address or the trigger signal; a first logic gate (reference numeral 17 in FIG. 11) for supplying the result of a NAND operation between the core activating pulse and the signal for controlling precharge and activation of the sense amplifier to a precharge circuit; and a second logic gate (reference numeral 18 in FIG. 11) for supplying the result of an AND operation between the core activating pulse and the signal for controlling the precharge and the activation of the sense amplifier to the precharge circuit. When the trigger signal is made active and the least significant bit signal X0' of the refresh address indicates "0", for example, the sense amplifier (SA) is not activated but only the precharge of the bit line pair is performed, whereas when the least significant bit signal X0' of the refresh address indicates "1", for example, the sense amplifier (SA) is activated. Thus, the least significant bit signal of the refresh address is used for controlling alteration. For example, as for time "*1" and "*2" shown in FIG. 8, at time "*1", the first Word line WL1 is activated and the bit line pair is precharged, whereas at time "*2", the first and second word lines WL1 and WL2 are activated and the sense amplifier-activating signal (SE) is also activated.

In one embodiment of the present invention, the following are provided: a circuit (reference numeral 41 in FIG. 12) for generating, based on a predetermined bit signal of the refresh address signal, an output from the refresh cycle period-switching-determining circuit, and an output from the logic gate, a first signal corresponding to the bit signal and a complimentary signal of the first signal (for example, X0 and /X0); and decode circuits (logic gates 13, 14, 15, and 16 in FIG. 11) for controlling activation of the first and second word lines (WL1, WL2) based on an X address signal (X1).

In accordance with the present invention, a method of controlling a semiconductor memory device is provided for controlling a semiconductor memory device comprising: a cell array having a plurality of memory cells, the cell array including at least; a bit line pair comprising first and second bit lines commonly connected to one sense amplifier (SA); a first memory cell (MC1) including a first memory cell transistor, the gate of which is connected to a first word line (WL1) and one of the source or drain of which is connected to the first bit line, and a first capacitor element connected to the other one of the drain and source of the first memory cell transistor; and a second memory cell (MC2) including a second memory cell transistor, the gate of which is connected to a second word line (WL2) and one of the drain and source is connected to the second bit line, and a second capacitor element connected to the other one of the drain and source of the second memory cell transistor; wherein, in a normal mode, the first and second word lines are assigned separate addresses from each other, and write and read operations for data are performed in the first and second memory cells separately; whereas in a partial mode, the first and second word lines are assigned the same address, and the first and second memory cells form a twin cell that complimentarily stores and holds one bit of data by two cells. The method comprises the following steps, in storing, among the first and second memory cells comprised in the twin cell, a cell data of the first memory cell, which is a copy source, into the second memory cell, which is a copy destination, when switched from the normal mode to the partial mode.

Step A: In storing a cell data of the first memory cell (MC1) into the second memory cell (MC2) when switched from the normal mode to the partial mode, the second word line (WL2) is activated in a precharge period for the bit line pair comprising the first and second bit lines based on a trigger signal generated by a refresh timer for controlling an interval of a self-refresh operation.

Step B: Subsequently, precharge is completed, and the first word line (WL1) is activated based on a delayed signal of the trigger signal, and thereafter, the sense amplifier is activated to amplify a differential voltage between the bit line pair, so that the cell data of the first memory cell is written back to the first and second memory cells.

In the present invention, a cycle period of the trigger signal generated by the refresh timer is made to be the same period as the cycle period in the normal mode during a period until the memory cells in the cell array are refreshed at least one time after entering the partial mode (the period is herein referred to as "one refresh period"), and after the one refresh period, the cycle period of the trigger signal generated by the refresh timer is made to be a longer cycle period than the period in the normal mode.

In accordance with one embodiment of the present invention, a method of controlling a semiconductor memory device comprises the following steps, in storing, among the first and second memory cells comprised in the twin cell, a cell data of the first memory cell, which is a copy source, into the second memory cell, which is a copy destination, when switched from the normal mode to the partial mode.

Step A: The first word line (WL1) is activated based on a trigger signal generated by a refresh timer regulating an interval of a self-refresh operation after completing precharge of the bit line pair comprising the first and second bit lines, subsequently the sense amplifier is activated, and the activated sense amplifier amplifies the cell data of the first memory cell (MC1) that appears on the bit line pair.

Step B: Subsequently, while the first word line (WL1) and the sense amplifier (SA) are kept in an activated state, the second word line (WL2) is activated to write back the cell data of the first memory cell (MC1) into the second memory cell (MC2).

The period of activating the first word line connected to the first memory cell, which is a copy source, among two word lines connected to the two memory cells comprised in the twin cell is made the same as the activation period (=t0) of the word line in the normal mode in a period until the copy by a refresh operation of cell data between the two memory cells comprised in the twin cell is cycled at least one time in the cell array after entering the partial mode, and the period of activating the second word line connected to the second memory cell, which is a copy destination of the cell data, is made a shorter period than the activation period for word lines in the normal mode. Alternatively, in the present invention, the cycle period of the trigger signal generated by the refresh timer is made a shorter cycle period than or the same cycle period as the cycle period in the normal mode during a period until the refresh of the memory cells in the cell array is cycled at least a predetermined number of times (for example, two or three times) after entering the partial mode, and thereafter, the cycle period of the trigger signal generated by the refresh timer is made a longer cycle period than the period in the normal mode.

In accordance with one embodiment of the present invention, a method of controlling a semiconductor memory device comprises the following steps, in storing, among the first and second memory cells comprised in the twin cell, a cell data of the first memory cell, which is a copy source, into the second memory cell, which is a copy destination, when switched from the normal mode to the partial mode.

Step A: When set from the normal mode to the partial mode, the first word line (WL1) is activated to write a precharge voltage into the first memory cell (MC1) in a precharge period for the bit line pair comprising the first and second bit lines based on a trigger signal generated by a refresh timer for controlling an interval of a self-refresh operation.

Step B: Subsequently, based on the next trigger signal, precharge is completed, the first and second word lines are activated, and further, the sense amplifier (SA) is activated so that the cell data of the second memory cell that appears on the bit line pair are written back into the first and second memory cells.

In the present invention, the cycle period of the trigger signal generated by the refresh timer is made the same cycle period as the cycle period in the normal mode, during a period until the refresh of the memory cells in the cell array is cycled at least one time after entering the partial mode, and thereafter, the cycle period of the trigger signal generated by the refresh timer is made a longer cycle period than the cycle period in the normal mode.

A method of controlling a semiconductor memory device in accordance with the present invention has the following steps.

Step A: In storing a cell data of the first memory cell (MC1) into the second memory cell (MC2) when set from the normal mode to the partial mode, the first word line is activated based on a trigger signal generated by a refresh timer that controls a self-refresh operation, and the sense amplifier (SA) is activated.

Step B: While the first word line (WL1) is kept in an activated state, the second word line (WL2) is activated so that the cell data of the first memory cell (MC1) is written back into the first and second memory cells. The first word line (WL1) is kept in an activated state for a longer period than in the normal mode, for example, a period that is two times longer than that in the normal mode. The first word line (WL2) is activated for the same period of time as in the normal mode.

Step C: In the present embodiment, a control is performed such that, if a read/write access occurs at the time after the trigger signal is output and the first word line (WL1) is activated but before the second word line (WL2) is activated, the first word line (WL1) is activated for the same period of time as in the normal mode and the activation of the second word line (WL2) is interrupted, so that a read/write operation is performed.

Step D: In the present embodiment, a control is performed such that, if a read/write access occurs after the first word line (WL1) is activated and the second word line (WL2) is activated, the first word line (WL1) is activated for a period two times longer than in the normal mode and the second word line (WL2) is activated for the same period as that in the normal mode so as to perform rewriting, and thereafter a read/write operation is performed.

In order to delineate the above-described preferred embodiments of the present invention in more details, examples of the present invention are described below with reference to the drawings.

Figure 1:
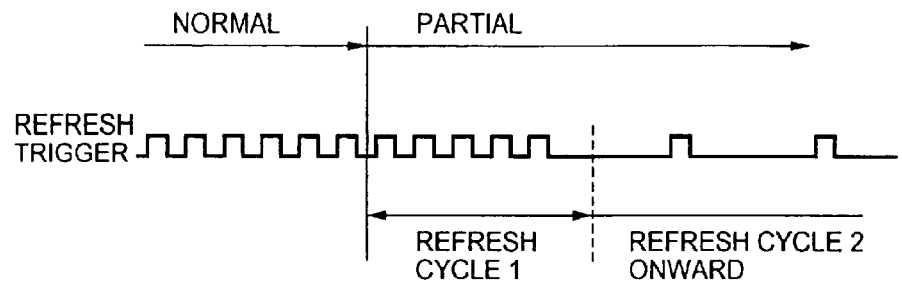
FIG. 1 is a timing chart for illustrating a first example of the present invention.
Figure 14:
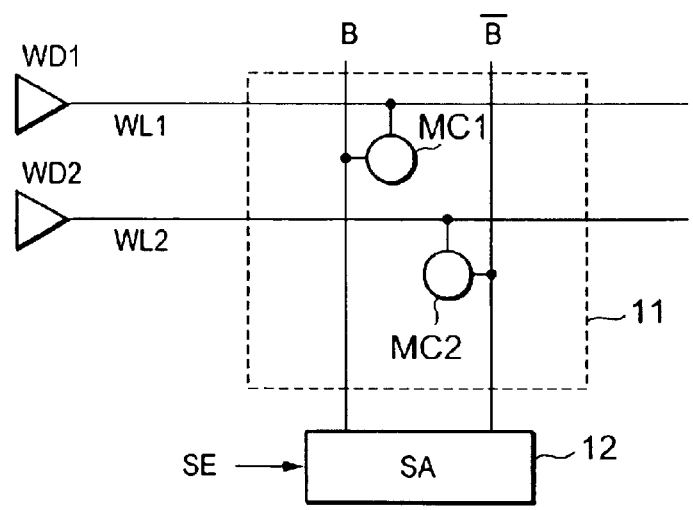
FIG. 14 is a diagram schematically showing the configuration of a conventional semiconductor memory device that performs two cells/one bit data storage.
Figure 15A:
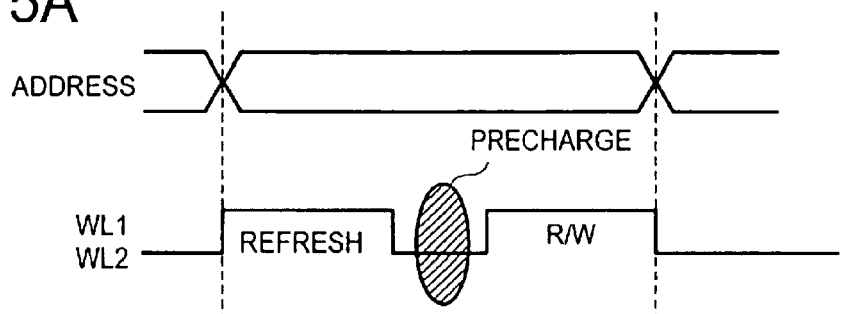
FIG. 15A is a chart showing the timing of read/write operations and cell data copying by the refresh by simultaneous selecting of the word lines WL1 and WL2.
Figure 15B:
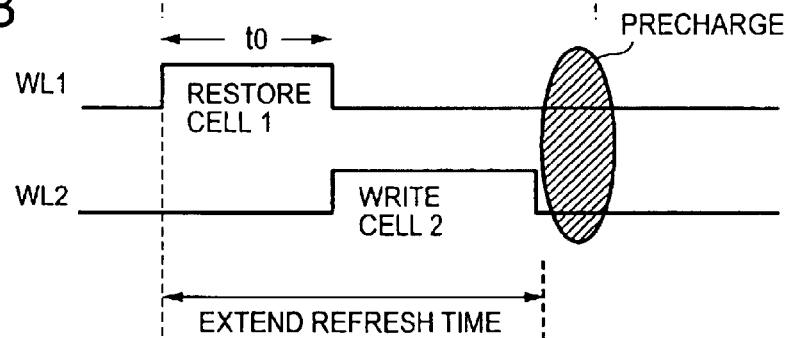
FIG. 15B is a chart showing the timing of read/write operations and cell data copying by the refresh by selecting of the word lines WL1 and WL2 at different timing.
Figure 16:
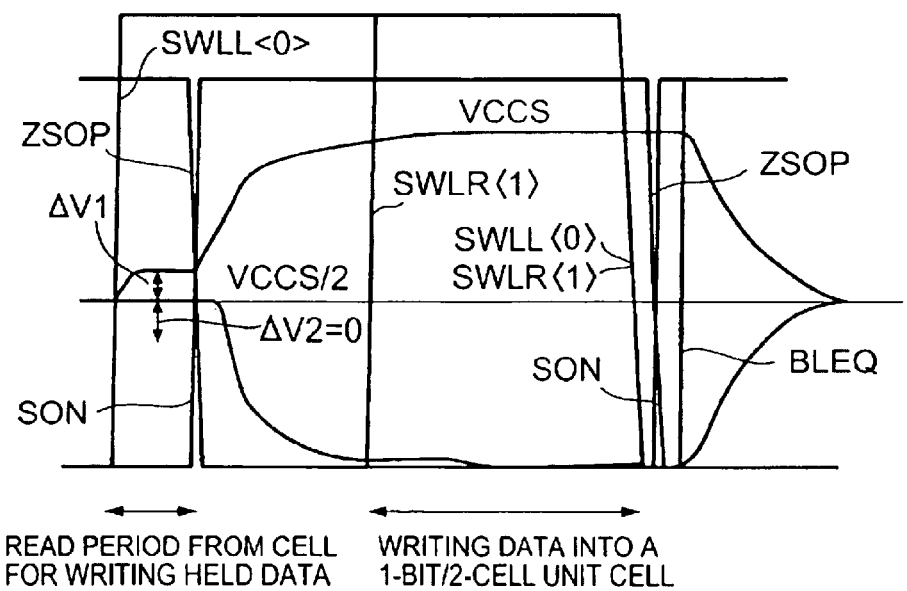
FIG. 16 shows FIG. 10 of Patent Document 1.

FIG. 1 is a timing chart for illustrating the operation of a first example of the present invention, which shows a timing waveform of a refresh trigger signal in a normal mode and in a partial mode. In the present example, the configuration of the cell array is that shown in FIG. 14. Memory cells MC1 and MC2, which form a twin cell, are connected to a bit line pair B, /B, the respective bit lines of which are commonly connected to a sense amplifier (SA) 12, and are connected to first and second word lines WL1 and WL2, respectively. In FIG. 1, in a normal mode, the first and second word lines WL1 and WL2 shown in FIG. 14 are assigned separate addresses, and a self-refresh operation is performed in the intervals between each access. In a partial mode, the first and second word lines WL1 and WL2 shown in FIG. 14 are assigned the same address, and one bit of data is stored in the first and second memory cells MC1 and MC2 as complementary data.

The pulse interval (cycle period) of the refresh trigger signal (simply referred to as "trigger signal") is made the same as the cycle period of the trigger signal in the normal mode at least during a period until a refresh operation for copying the cell data of the first memory cell MC1 of the two memory cells in the twin cell into the second memory cell MC2 is cycled, for example, at least one time for the memory cells in the cell array 11 after entering the partial mode (the period is herein referred to as "one refresh period"). After the one refresh period in the partial mode, the cycle period of the trigger signal is made a longer cycle than the cycle period of the trigger signal in the normal mode.

Figure 2:
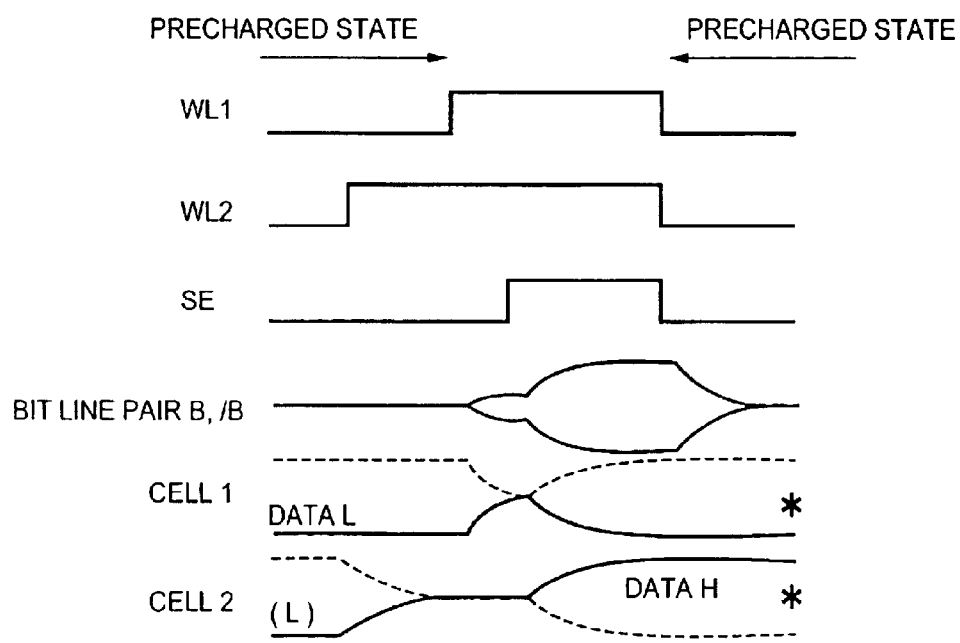
FIG. 2 is a timing chart for illustrating the first example of the present invention.

FIG. 2 is a timing waveform chart for illustrating the operation of a cell array according to the first example of the present invention in the partial mode, which show signal waveforms on the first and second word lines WL1 and WL2, and a bit line pair B, /B shown in FIG. 14. It should be noted that in the normal mode, a data LOW is written in the first memory cell MC1, and a data LOW is written in the second memory cell MC2.

When switched to the partial mode, the second word line WL2 connected to the second memory cell MC2, which is a copy destination, is raised to a HIGH level prior to the rise of the first word line WL1 connected to the first memory cell MC1, which is a copy source, in a precharge period (in which the bit lines are precharged to ½VCC) that is before the rise of the first word line WL1; thus, reset is achieved by writing a precharge voltage into the second memory cell MC2, which is a copy destination.

Subsequently, the precharge to the bit line pair B, /B is stopped and the first word line WL1 is brought to a HIGH level. Thereafter, a sense enable signal SE is brought to a HIGH level, and the sense amplifier (SA) 12 amplifies the differential voltage between the bit line pair B, /B, so that the data LOW is written back into the first memory cell MC1 and the data HIGH into the second memory cell MC2 with the same timing.

The first one refresh cycle after switching to the partial mode from the normal mode is used for copying the cell data of the first memory cell MC1 into the second memory cell MC2, and the refresh timer period is made the same as that in the normal mode. Thereafter, a control is performed such as to extend the cycle period of the trigger signal for one bit-two cell scheme.

FIG. 3 is a diagram showing an example of the circuit configuration for controlling activation of word lines in the first example of the present invention. The circuit is provided with the following: a circuit 20 (input buffer/latch circuit) for receiving an external address (Ext Add) supplied to the semiconductor memory device from an external device (not shown) such as a CPU and a memory controller, and for latching and outputting it; a refresh timer 23 for clocking a predetermined time and outputting a trigger signal when an overflow occurs; a refresh address generator 22 for receiving the trigger signal from the refresh timer 23 and for, for example, counting up a refresh address and outputting it; a multiplexer 24 for receiving an output signal from the input buffer/latch circuit 20 (external address signal) and an output signal from the refresh address generator 22 (refresh address signal) and for selecting and outputting the output signal of the refresh address generator 22 when in a refresh operation; a decoder 25 for receiving an output (row address) from the multiplexer 24 and for decoding the row address; first and second one-shot pulse generators 28 and 29 for generating respective one-shot pulses based on the trigger signal and an output signal from the timer 23 that has been delayed by a delay circuit 27, respectively; a multiplexer 26 for receiving output signals from the first and second one-shot pulse generators 28 and 29 and for outputting one of them to a second word driver WD2; and the delay circuit 27.

A first word driver WD1 receives a first decode signal output from the decoder 25, and an output signal from the first one-shot pulse generator 28, and drives the first word line WL1 with a high-voltage. The second word driver WD2 receives a second decode signal output from the decoder 25, and a signal output from the multiplexer 26, and drives the second word line WL2 with a high voltage.

A cell array 11 has first and second bit lines B, /B commonly connected to one sense amplifier (SA) 12, a first memory cell MC1, and a second memory cell MC2. The first memory cell MC1 includes a first memory cell transistor NM1, the gate terminal of the which is connected to a first word line WL1 driven by the first word driver WD1 and one of the drain or source of which is connected to the bit line B, and a capacitor C1, which is connected to the other one of the drain or source terminal of the memory cell transistor NM1. The second memory cell MC2 includes a memory cell transistor NM2, the gate terminal of which is connected to a second word line WL2 driven by the second word driver WD2 and one of the drain or source terminal of which is connected to the bit line /B, and a capacitor C2, which is connected to the other one of the drain or source terminal of the second memory cell transistor NM2. A terminal of each of the capacitor elements (C1, C2) in the memory cell that is not the terminal connected to the memory cell transistor is set at a ground potential (GND) (or at an intermediate voltage ½VCC (one half VCC)). Further provided are: the first and second NMOS transistors NM4 and NM5 that are connected between the first and second bit lines B, /B and a precharge power supply VCC/2 and the gates of which are connected to a precharge control signal $\phi$; a third NMOS transistor NM3 for equalizing, the gate of which is connected to the precharge control signal $\phi$ and which is inserted between the first and second bit lines B and /B. These NMOS transistor circuits form a precharge circuit. A sense amplifier 12 connected to the first and second bit lines B, /B differential amplifies the differential voltage between the bit lines B and /B when the sense enable signal SE is at a HIGH level. It should be noted that for the sake of simplicity in explanation, only two word lines WL1 and WL2, and a pair of bit lines B and /B are shown schematically in FIG. 3, but it will be apparent that the present invention is not limited to such a configuration and may employ a configuration comprising any plural number of word lines and any plural sets of bit line pairs.

An outline of the operations in a circuit configuration of the present example is described below. The decoder 25 treats the first and second word lines WL1 and WL2 as having different addresses when a MODE signal indicates the normal mode, whereas when entering the partial mode, it selects the first and second word lines WL1 and WL2 at the same time. More specifically, the first and second word lines WL1 and WL2 are selected at the same time when the refresh trigger signal is set to have a long cycle period after the partial mode has been entered and a copy of cell data has been performed between two memory cells forming a twin cell.

The multiplexer 26 selects the output from the second one-shot pulse generator 29 in the first refresh cycle (a cycle in which a refresh operation is cycled one time for the memory cells in the cell array) in the partial mode, and supplies it to the second word driver. At that time, a one-shot pulse that is output from the first one-shot pulse generator 28 that receives as input a trigger signal delayed by the delay circuit 27 is supplied to the first word driver WD1. Each of the first and second word drivers WD1 and WD2 drives a word line with a high voltage (stepped-up voltage) based on the one-shot pulse signal that has been input when the selecting signal output from the decoder 25 is at a HIGH level.

When the refresh operation for the cells in the cell array 11 is performed one cycle after entering the partial mode (for example, when the count output from the refresh address generator 22 is counted up from the beginning address to the end address), the multiplexer 26 selects the output from the first one-shot pulse generator 28 based on a switching signal and supplies it to the second word driver WD2 from then on. Accordingly, a common one-shot pulse is supplied to the first and second word drivers WD1 and WD2, and the first and second word lines WL1 and WL2 are activated at the same time.

Figure 4A:
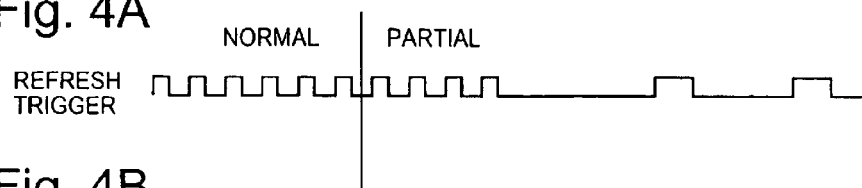
FIG. 4A is a chart showing a refresh trigger signal in the first example of the present invention.
Figure 4B:
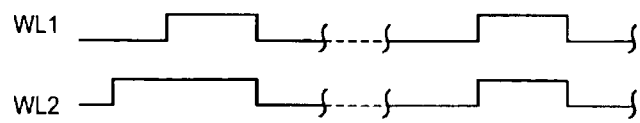
FIG. 4B is a chart showing an example of timing waveforms of word lines WL1 and WL2 in the partial mode in the first example of the present invention.

FIG. 4A shows a signal waveform of the refresh trigger signal, and FIG. 4B shows signal waveforms on the first and second word lines WL1 and WL2 of FIG. 3 in the partial mode shown in FIG. 4A. As shown in FIG. 4B, the second word line WL2 is activated by a refresh trigger with a short cycle period in the partial mode shown in FIG. 4A, thus resetting the second memory cell MC2, and thereafter, the first word line WL1 is activated and then the sense amplifier 12 is activated, so that the cell data of the first memory cell MC1 is written back to the second memory cell MC2. After the copy of cell data in the partial mode has been cycled one time, the cycle period of the trigger signal from the refresh timer 23 shown in FIG. 3 is extended, and the first and second word lines WL1 and WL2 are assigned the same address (thus, the decoder 25 activates the signals supplied to the first and second word drivers WD1 and WD2 at the same time). The first and second word lines WL1 and WL2 are activated at the same time based on the one-shot pulse signal that is output from the first one-shot pulse generator 28, so that the complementary data held in the first and second memory cells (MC1 and MC2), which together form a twin cell, are read out by the sense amplifier 12 and are written back (restored) into the first and second memory cells (MC1 and MC2).

FIGS. 5 and 6 are timing waveform charts for illustrating operations in a second example of the present invention. In the second example of the present invention, the basic configuration of the cell array is the same as that shown in FIG. 14, but the timing control for the signals is different. Referring to FIG. 6, in the present example, in the partial mode, the first word line WL1 connected to the first memory cell MC1 shown in FIG. 14 is activated with the same pulse width (t0) as that in the normal mode, and subsequently, the sense enable signal SE is activated to amplify the differential voltage between the bit line pair B, /B. At the time when the differential voltage between the bit line pair B, /B is widened, the second word line WL2 connected to the second memory cell MC2 is brought to a HIGH level. The second word line WL2 is activated for a pulse width period that is about half of that in the normal operation, and then, the first and second word lines WL1 and WL2 are controlled so as to lower their levels at the same time.

In the present example, because the sense amplifier 12 is also activated when the second word line WL2 is activated, it is possible to inverse the cell data even if a write operation into the second memory cell MC2 (also simply referred to as "cell 2") occurs. However, if a copy is attempted from the first memory cell MC1 to the second memory cell MC2 within the same time To as the refresh period in the normal mode, the restore level (the level of write back) becomes low. In particular, as indicated by double asterisks "**" for "cell 2" in FIG. 6, the restore level (the level of writing back) becomes low in the "cell 2". For this reason, as shown in FIG. 5, the refresh operation is carried out with a shorter cycle period of the refresh trigger signal than that in the normal mode, during a period until the copy of the cell data from one of the two memory cells that are comprised in a twin cell into the other memory cell by the refresh operation, is cycled two or three times for all the memory cells in the cell array after switching from the normal mode to the partial mode. After that, the refresh operation is performed with an extended cycle period of the trigger signal. In the present example, the cycle period of the refresh trigger signal is initially made shorter than the cycle period in the normal mode when switched from the normal mode to the partial mode, and the reason is as follows. In the present example, as the second word line WL2 is raised later than the rise of the first word line WL1, the load is greater, reducing the restore potential for a cell, and therefore, the hold characteristic (time) of a cell is shortened. The reason why the cycle period of the refresh trigger signal is made longer than that in the normal mode thereafter is because, when writing of the complementary data into two cells is completed, the hold time is lengthened because of the effect inherent to the twin cell. Accordingly, in the present example, the cycle period of the refresh trigger signal for copying cell data when switching from the normal mode to the partial mode (the cycle period of the refresh trigger signal shown as two or three refresh cycles in FIG. 5) is determined to be a predetermined value equal to or less than the cycle period in the normal mode, taking into consideration the restore potential at the time of the copy of cell data between cells and the hold characteristic of the twin cell.

Figure 7:
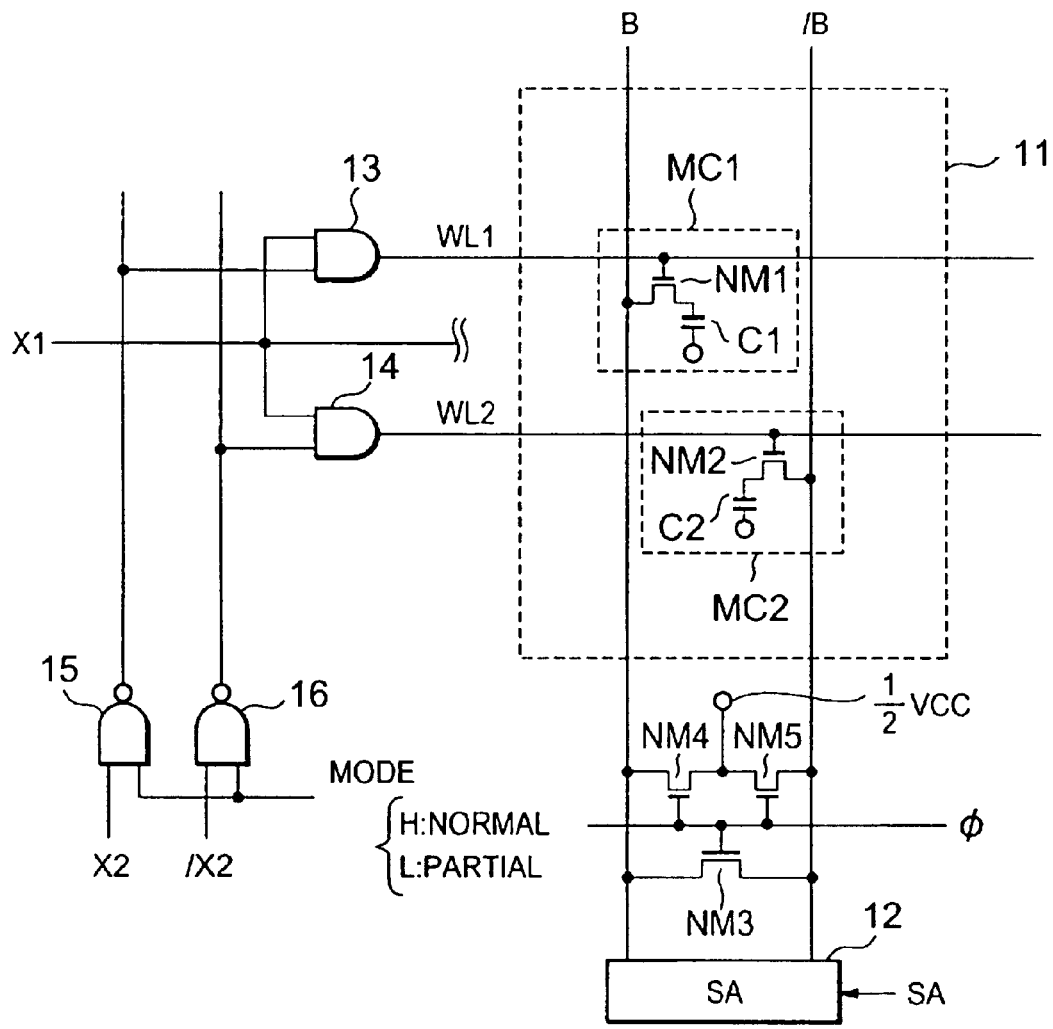
FIG. 7 is a diagram showing the configuration of a third example of the present invention.

FIG. 7 is a diagram showing an example of the configuration in which data in multiple cells are held in the partial mode according to the first and second examples of the present invention, which illustrates a portion of the configuration of the decoder 25 shown in FIG. 3 as an example.

When in the normal mode, the first and second word lines WL1 and WL2 are assigned separate addresses from each other according to the values of address signals (row addresses) X1, and X2 and /X2. Specifically, in the normal mode, a control signal MODE is brought to a HIGH level, and when the address signal X2 is at a LOW level (/X2 is at a HIGH level), the output from a logic gate 15 comprising a two input NAND circuit is brought to a HIGH level while the output from a logic gate 16 comprising a two input NAND circuit is brought to a LOW level. At that time, the output signal from a logic gate (AND circuit) 13, which receives as input the address signal X1 and the output from the logic gate 15, is brought to a HIGH level, while the output signal from a logic gate (AND circuit) 14, which receives as input the address signal X1 and the output from the logic gate 16 is brought to a LOW level; thus, the first word line WL1 is selected. When the address signal X2 is at a HIGH level (/X2 is at a LOW level), the output signal from the logic gate 15 is brought to a LOW level while the output signal from the logic gate 16 is brought to a HIGH level. Accordingly, when the row address signal X1 is at a HIGH level, the output signal from the logic gate 13 is brought to a LOW level while the output signal from the logic gate 14 is brought to a HIGH level; thus, the second word line WL2 is selected.

On the other hand, in the partial mode, the control signal MODE is brought to a LOW level, and both the output signals from the logic gates 15 and 16 are brought to a HIGH level. Accordingly, when the row address signal X1 is at a HIGH level, the output signals from the logic gates 13 and 14 are brought to a HIGH level; thus, the first and second word lines WL1 and WL2 are selected and activated at the same time by a word driver, which is not shown in the figures.

FIG. 8 is a timing chart for illustrating the operations in a third example of the present invention. In the third example of the present invention as well, the basic configuration of the cell array is the same as that shown in FIG. 14, and only the signal timing control is different. When in the normal mode, based on the trigger signal of the refresh timer, selection of word lines is performed between the first and second word lines WL1 and WL2 and the sense amplifier (SA) 12 is activated, so that write-back of data is carried out for each cell.

In the partial mode, first, the bit lines B, /B are brought to a precharged state with the precharge control signal φ=HIGH and the sense enable signal SE=LOW. In the precharge period, the first word line WL1 is selected based of the trigger signal (see "*1" in FIG. 8), and then, a precharge voltage, i.e., ½VCC is written into the cell 1 to reset it.

Subsequently, based on the next cycle's trigger signal, the first and second word lines WL1 and WL2 are selected at the same time (see the timing indicated by "*2" in FIG. 8), a cell data of the second memory cell MC2 is read out to the sense amplifier 12 so that the cell data of the second memory cell MC2 is written complimentarily into the first memory cell MC1 and the second memory cell MC2. Since the potential of the first memory cell MC1 is made the same potential as that of the bit line pair B, /B at time *1 indicated in FIG. 8, the data in the second memory cell MC2 is not destroyed.

FIG. 9 is a chart for illustrating a fourth example of the present invention. In this example, as shown in FIG. 9B, a 32 Mbit DRAM in the normal mode is used as a 16 Mbit DRAM in the partial mode so that one bit of data are held in two cells. FIG. 9(A) is a timing chart showing signal waveforms on word lines Word1 and Word2 (corresponding to WL1 and WL2 in FIG. 14) and of the refresh trigger signal, which are in the normal mode and in the partial mode. In FIG. 9A, the copy of cell data is performed between two memory cells comprised in the twin cell in the first refresh cycle at the time when entering the partial mode, as indicated by "rewrite" in FIG. 9(A).

As shown in FIG. 9C, in the present example, the activate time (pulse width) for the first word line Word1 is lengthened (for example, it is made twice the pulse width in the normal mode), and the second word line WL2 is raised later (the pulse width for the second word line Word2 is made the same as the pulse width in the normal mode), so as to rewrite the cell data from the first memory cell to the second memory cell side.

After entering the partial mode, during a cycle in which the refresh operation for the memory cells in the cell array is cycled one time, the cycle period of the refresh trigger is made the same as that in the normal mode, and rewrite is carried out from one of the two memory cells comprised in the twin cell to the other memory cell during that time. In this case, the activation period for the first word line Word1 is made longer. For this reason, if an interrupt or the like (READ/WRITE access) occurs during the activation period for the word line, control is performed to stop the refresh operation. For example, in FIG. 9C, if an access is made to the cell array (for example, a chip select signal is set to a LOW level) during the activation period (high voltage period) for the first word line Word1, the first word line Word1 is brought from an activated state to an inactivated state, the second word line Word2 is not brought into an activated state, as indicated by the asterisks "*" and dashed lines in FIG. 9C, and the activation of the sense amplifier is stopped (see the asterisk "*" and dashed line for the bit line pair B, /B), to perform an access operation to the memory cell.

FIG. 10 is a timing chart for illustrating the interruption of the refresh operation in the fourth example of the present invention. As shown in FIG. 10A, when the timing at which a chip select signal /CS is brought to a LOW level (at which a chip selection is activated and an access cycle starts) is later than the output of the trigger signal from the refresh timer and earlier than the rise of the second word line Word2, the first word line Word1 is brought back to the same short pulse as in the normal mode and the activation of the second word line Word2 is stopped (indicated by the dashed line in the figure), to enter a READ operation or the like.

On the other hand, as shown in FIG. 10B, when /CS is brought to a LOW level after the rise of the second word line Word2, the refresh operation for the first word line Word1 (pulse width=2t0) and the second word line Word2 (pulse width=t0) is completed, and thereafter, a read/write operation is carried out.

In either case of FIG. 10A or FIG. 10B, performance degradation due to access delay is avoided by the refresh operation, and the access time tAA, which is from a time when the chip select signal /CS is activated (LOW level) until a time when a read data DOut is output, is made equal to or less than the specification value.

Figure 11:
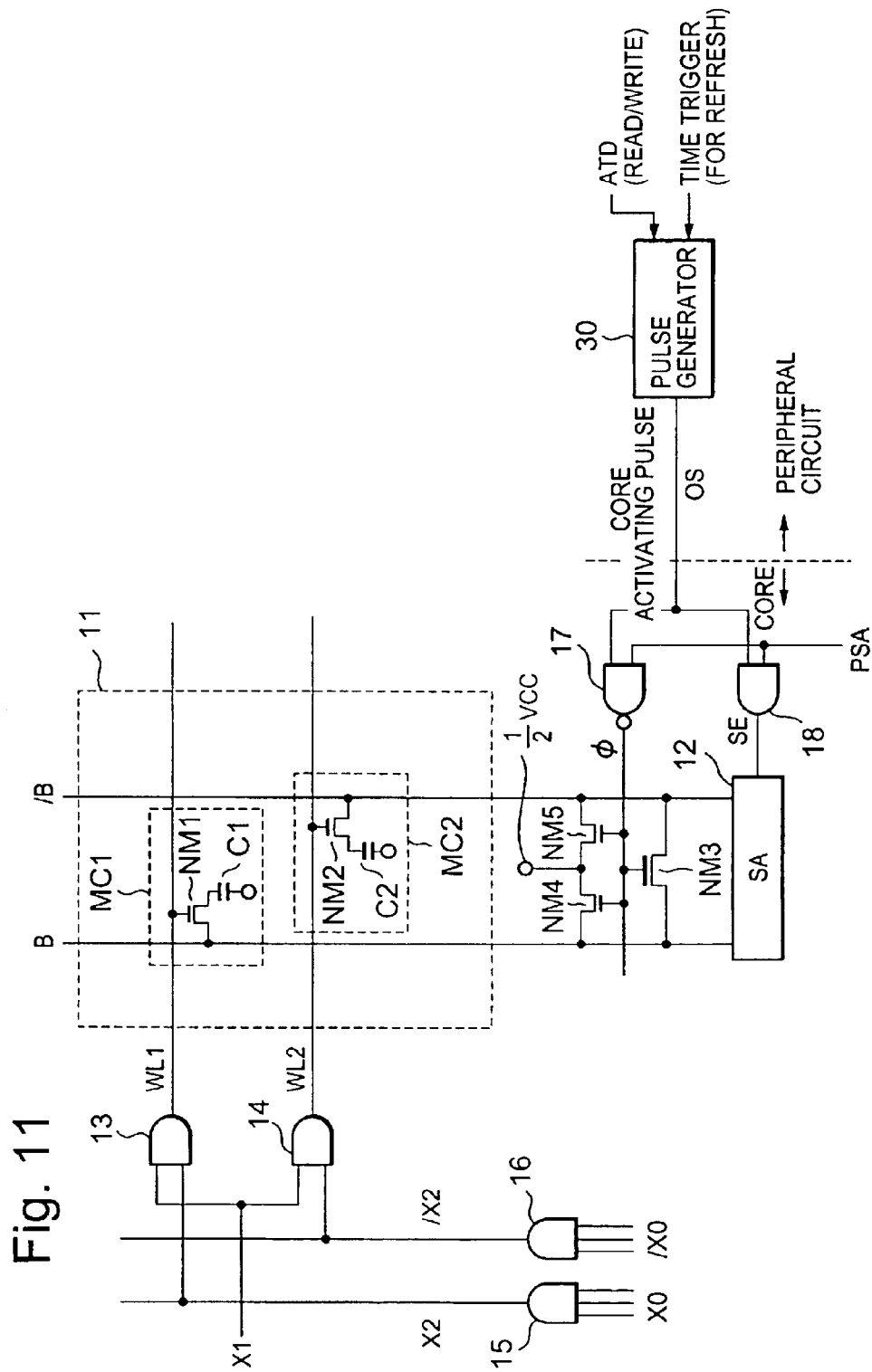
FIG. 11 is a diagram showing a modified example of the third example of the present invention.

FIG. 11 is a diagram showing a variation of the third example of the present invention. In FIG. 11, the address signals X0 and /X0 are a least significant address switch signal for the decoders 15 and 16. The outputs from the decoders 15 and 16 are supplied as address signals X2 and /X2 to one input terminal of each of the logic gates 13 and 14, which receive the address signal X1 at the other input. The inputs of the decoders 15 and 16 other than X0 and /X0 are any other address signals than address signals X0, X1, and X2. The decoders 15 and 16 are configured as follows. When, for example, the signal X0 is at a HIGH level ("1"), the signal X2 is brought to HIGH and /X2 to LOW, so the first word line WL1 is selected when the signal X1 is at HIGH. When the signal X0 is at LOW ("0"), the signal X2 is brought to LOW and the signal /X2 to HIGH, and thus, the second word line WL2 is selected. On the other hand, in the partial mode, the first and second word lines WL1 and WL2 are assigned the same address to activate, the logic gates 15 and 16 bring both the signal X2 and the signal /X2 to HIGH so that when the signal X1 is at HIGH, the first and second word lines WL1 and WL2 are selected.

Referring to FIG. 11, further provided is a pulse generating circuit 30 for generating a core activating pulse (one-shot pulse) when receiving either one of an address transition-detecting signal (ATD) from an address transition-detecting circuit (not shown) and a trigger signal from the refresh timer. The output from the pulse generating circuit 30 is input to one input terminal of each of a logic gate 17 comprising a NAND circuit and a logic gate 18 comprising an AND circuit.

The logic gate 17 receives a PSA (precharge, sense amplifier-activating signal) at the other input terminal, and the output signal φ therefrom is brought to a LOW level when both the core activating pulse and the signal PSA are at a HIGH level. When the output signal φ is at a HIGH level, precharging of the bit line pair B, /B is performed. The precharge control signal φ is brought to a LOW level while the signal PSA is at a HIGH level when the core activating pulse of FIG. 11 is at a HIGH level. By inactivating the signal PSA (bringing to a LOW level), the precharge control signal φ is brought to a HIGH level, and the bit line pair B, /B is precharged to a precharge voltage (½VCC).

The logic gate 18 receives the signal PSA (precharge, sense amplifier-activating signal) at the other input terminal, and when both the core activating pulse and the signal PSA are at a HIGH level, it brings the sense enable signal SE to a HIGH level to activate the sense amplifier (SA) 12.

FIG. 12 is a diagram showing an example of a circuit for generating signals PSA, X0, and /X0 shown in FIG. 11. Referring to FIG. 12, the circuit is provided with the following: a refresh timer 31; a frequency dividing circuit 32 for dividing frequency of the output signal from the refresh timer 31; a multiplexer 33 for receiving the frequency-divided output from the frequency dividing circuit 32 and the output from the refresh timer 31 and for selecting and outputting one of them as a trigger signal based on a decision output from a refresh cycle-switching-determining circuit 38; and a logic gate 37 for receiving a chip select signal /CS that is activated when at a LOW level and a control signal MODE for controlling switching between the normal mode and the partial mode, and for bringing a node A to a HIGH level when the chip select signal /CS is HIGH and the control signal MODE is LOW.

The refresh cycle-switching-determining circuit 38 is for determining the refresh cycle period, and switches the signal level at a node B based on the output signal from the logic gate 37 so that in the normal mode, it keeps the output signal (signal at the node B) at a LOW level, and in the partial mode, it keeps the signal at a LOW level until the refresh operation for the cell array is cycled, for example, one time but brings the signal to a HIGH level after the refresh for the cell array is cycled one time.

Figure 13:
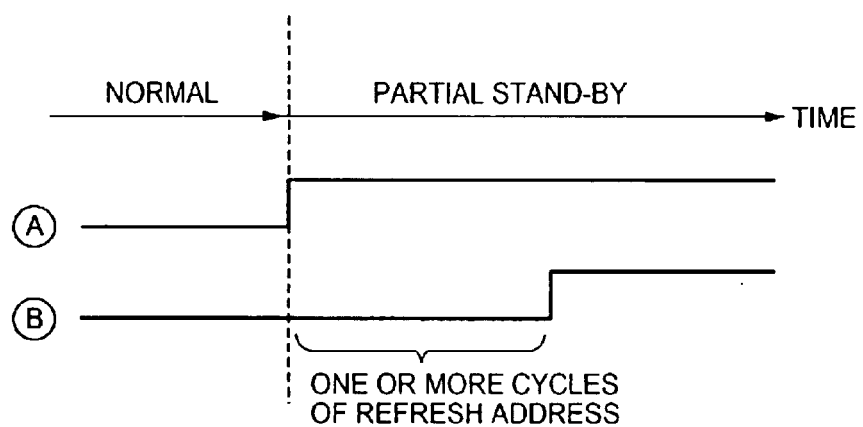
FIG. 13 is a chart showing signal waveforms at nodes A and B in FIG. 12.

As shown in FIG. 13:

when the node A and the node B are LOW, the normal mode will result;

when the node A is at a HIGH level while the node B is at a LOW level, a short cycle period in the partial mode will result; and when the node A and the node B are HIGH, a long cycle period in the partial mode will result.

The multiplexer 33 selects the output signal from the timer 31 when the output signal from the refresh cycle-switching-determining circuit 38 is at a LOW level, while it selects and outputs the frequency division signal from the frequency dividing circuit 32 (cycle period t1 of the frequency division signal>cycle period of the output signal from the timer 31) when the output signal from the refresh cycle-switching-determining circuit 38 is at a HIGH level.

An X0 and /X0 control circuit 41 receives as input the least significant bit X0' of the refresh address-generating circuit 39 and the signal voltages from the node A and the node B, and outputs X0 and /X0. The X0 and /X0 control circuit 41 outputs X0 and /X0 signals when both the signal levels of the node A and the node B are at a LOW level (see "Normal" in FIG. 13). Note that X0 is the value of the input X0', and /X0 is the inverted value of X0'. Accordingly, in the normal mode, when the signals X1 and X0 are at a HIGH level, the first word line WL1 is selected, whereas when the signals X1 and /X0 are at a HIGH level, the second word line WL2 is selected.

The X0 and /X0 control circuit 41 outputs HIGH ("1") as a signal X0 shown in FIG. 11, irrespective of the value of X0' when the node A is at a HIGH level and the node B (the output signal from the refresh cycle-switching-determining circuit 38) is at the LOW level; and it outputs, as the signal /X0, LOW ("0") when X0' is at a LOW level but HIGH ("1") when X0' is at a HIGH level. In this case, the first word line WL1 rises when the signal X1 shown in FIG. 11 is at a HIGH level, and later, the second word line WL2 rises. The X1, /X0 control circuit 41 outputs such a signal X0 and a signal /X0 that X2 shown in FIG. 11 becomes "1" and /X2 becomes "1" (for example, X0=HIGH and /X0=HIGH) when the node A is at a HIGH level and the node B is at a HIGH level. In this case, the first and second word lines WL1 and WL2 rise at the same time.

A precharge sense amplifier-activating signal-generating circuit 40 receives the trigger signal selected by the multiplexer 33, the least significant bit X0' of the refresh address from the refresh address-generating circuit 39, and signal levels of the node A (the output from the logic gate 37) and the node B (the output signal from the refresh cycle-switching-determining circuit 38), and performs control as follows. During a period until the refresh operation for the cell array is cycled, for example, onetime (during the period in which the node A shown in FIG. 13 is at HIGH level and the node B is at a LOW level) in the partial mode, upon receiving the trigger signal, it brings the precharge control signal p to a HIGH level to precharge the bit line pair B, /B when the least significant bit X0' of the refresh address is, for example, logic "0" (which corresponds to "*1" in FIG. 8). Upon receiving the next trigger signal, it activates the sense enable signal SE to activate the sense amplifier (SA) 12 when the least significant bit X0' of the refresh address is logic "1" (which corresponds to "*2" in FIG. 8).

In the partial mode, the precharge sense amplifier-activating signal-generating circuit 40 performs a control as follows. After the refresh of the cell array has been cycled one time (during a period in which the node A shown in FIG. 13 is at a HIGH level and the node B is at a HIGH level), it activates PSA to activate the sense amplifier (SA) 12 via the logic gate 18 upon receiving the trigger signal (a long cycle period shown in FIG. 8). It should be noted that in the normal mode, it brings the signal PSA to a HIGH level irrespective of the value of X0' upon receiving the refresh trigger signal.

Thus, the precharge sense amplifier-activating signal-generating circuit 40 sequentially performs controls for the precharge and the activation of the sense amplifier based on the value of the least significant bit signal X0' of the refresh address during the short cycle period in the partial mode, and it generates a one-shot pulse signal for activating the sense amplifier during the long cycle period. It should be noted that in the precharge sense amplifier-activating signal-generating circuit 40, it is possible to employ other bit signals of the refresh address such as a first bit signal X1' or a second or third bit signal to generate the PSA signal, in place of the least significant bit signal X0' of the refresh address. If the first and second word lines WL1 and WL2 do not have adjacent addresses, for example, if they have a difference corresponding to four addresses, a bit signal X2', for example, is input to the precharge sense amplifier-activating signal-generating circuit 40 and the PSA signal is generated based on the bit signal X2'. In this case, the signal X2' is also input to the X0 and /X0 control circuit 41 so that the X0 and /X0 control circuit 41 generates X2 and /X2, and the interval between "*1" and "*2" in FIG. 8 corresponds to the period for four trigger signals.

Although the present invention has been fully described by way of the above-described examples, it is to be noted that the present invention is not limited to the configurations described in the foregoing examples only, but embraces various changes and modifications that will be apparent to those skilled in the art unless such changes and modifications depart from the scope of the appended claims.

As has been described above, the present invention exhibits an advantageous effect that when one bit of data is stored by two cells, the cell data of one of the cells comprised in a twin cell can be rewritten into the other one of the cells without extending the refresh cycle period, and thus, performance degradation can be suppressed or reduced.

In addition, according to the present invention, writing of error data is prevented in the copy since the configuration is adopted in which, after the cell of a copy destination is reset, the data in a cell comprised in a twin cell is then restored.

Moreover, according to the present invention, the copy for two cells comprised in a twin cell is executed with the same refresh trigger period as that in the normal operation in which one bit is stored with one cell, and the refresh trigger period is extended after the cell array has been refreshed for several cycles; therefore, it is made possible to store and hold correct data without extending the refresh operation for the copy.

What is claimed is:

1. A semiconductor memory device, comprising:
a sense amplifier;
first and second word lines;
first and second bit lines coupled to said sense amplifier;
a first memory cell coupled to said first word line and said first bit line; and
a second memory cell coupled to said second word line and said second bit line;
wherein, in a normal mode, the first and second word lines are assigned separate addresses from each other, and data access operation is performed in the first and second memory cells separately;
whereas in a partial mode, the first and second word lines are assigned the same address to maintain one bit data in the first and second memory cells;
wherein, in order to copy a data in the first memory cell into the second memory cell, based on a switching from the normal mode to the partial mode,
the second word line is activated in a precharge period for the first and second bit lines, so that a precharge voltage is written into the second memory cell;
then, the first word line is activated; and
then, the sense amplifier is activated to amplify a differential voltage between the first and second bit lines to store said data stored in said first memory cell into said second memory cell.

2. The device as claimed in claim 1, further comprising:
a trigger signal generator which generates a refresh trigger signal to control a refresh operation of said first and second memory cells, when the copying is entry, said trigger signal generator generating said refresh trigger signal at a first period which is the same as a period of said refresh trigger signal generated at a period of said normal mode, then, said trigger signal generator generating said refresh trigger signal at a second period which is, longer than said first period.

3. The device according to claim 1, further comprising:
a timer to generate a trigger signal;
a delay circuit for delaying the trigger signal;
a first pulse-generating circuit for generating a first one-shot pulse based on the output of the delay circuit;
a first word driver which receives said first one-shot pulse to drive said first word line; and
a second pulse-generating circuit for generating a second one-shot pulse based on the trigger signal;
a selector circuit which receives said first and second one-shot pulses to output a selected one-shot pulse; and
a second word driver which receives said selected one-shot pulse to drive the second word line.

4. The device according to claim 3, wherein:
said timer generates said trigger signal with a first cycle and a second cycle which is different from said first cycle 5. The device according to claim 4, wherein:
said timer generates said trigger signal with said first cycle when said copy is performed and generates said trigger signal with said second cycle after said trigger signal with said first cycle is generated.

6. The device according to claim 5, wherein
said first cycle is the same period as a cycle with when said timer generates said trigger signal in said normal mode, said second cycle has a period which is longer than that of said first cycle.

7. The device according to claim 5, wherein
said first cycle has a period which is shorter than that of a cycle with when said timer generates said trigger signal in said normal mode, said second cycle has a period which is longer than that of said cycle with when said timer generates said trigger signal in said normal mode.

8. A semiconductor memory device, comprising:
a sense amplifier;
first and second word lines;
first and second bit lines coupled to said sense amplifier;
a first memory cell coupled to said first word line and said first bit line; and
a second memory cell coupled to said second word line and said second bit line;
wherein, in a normal mode, the first and second word lines are assigned separate addresses from each other, and data access operation is performed in the first and second memory cells separately;
whereas in a partial mode, the first and second word lines are assigned the same address to maintain one bit data in the first and second memory cells; and
wherein, in order to copy a data in the first memory cell into the second memory cell, based on a switching from the normal mode to the partial mode,
the first word line is activated;
then, the sense amplifier is activated to amplify a differential voltage between the first and second bit lines; and
the second word line is activated, thereby storing said data stored in said first memory cell into said second memory cell;
when said copying is operated, said first word line is activated at a first activate period, said second word line is activated at a second active period which is shorter than said first active period.

9. The device as claimed in claim 8, wherein
said first activate period is the same as that of said first word line in said normal mode.

10. The device as claimed in claim 8, wherein
said second activate period is the same as that of said first word line in said normal mode.

11. The device as claimed in claim 10, wherein
if a read/write access occurs at a time after the first Word line is activated but before the second word line is activated during said partial mode, the first word line is activated for the same period of time as the period of activating in the normal mode and is thereafter inactivated, and activation of the second word line is interrupted so that a read/write operation is performed.

12. The device according to claim 11, wherein if a read/write access occurs while the first word line is being activated and after the second word line is activated during said partial mode, the first word line is activated for a longer period than the period of activating in the normal mode, the second word line is activated for the same period as the activation period in the normal mode, and then a read/write operation is performed.

13. The device according to claim 8, further comprising:
a refresh timer which generates a trigger signal;
a frequency dividing circuit for dividing frequency of the trigger signal;
a logic gate for performing a logical operation between a chip select signal and a control signal for controlling the normal mode and the partial mode;
a refresh cycle period-determining circuit for, based on an output signal from the logic gate, determining a cycle period of the trigger signal to be a first cycle period and then to be a second cycle period longer than that of said first cycle when the control signal indicates the partial mode and the chip select signal is in an inactivated state, and determining the cycle period of the trigger signal to be said first cycle period when the chip select signal is in an activated state; and
a selector circuit for selecting an output signal from the refresh timer when said determining circuit produces said trigger signal with said first cycle period and selecting a frequency division signal from the frequency dividing circuit when said determining circuit produces said trigger signal with said second cycle period.

14. The semiconductor memory device according to claim 13, further comprising:
a circuit for generating a control signal for controlling precharge of the bit lines and activation of the sense amplifier based on the trigger signal output from the selector circuit, an output signal from the refresh cycle period-determining circuit, and an output signal from the logic gate;
a pulse generator for generating one-shot pulse, being a core activating pulse, for controlling activation of the cell array based on the trigger signal or detection of change of an address supplied from outside of the semiconductor memory device;
a first logic gate for supplying an output of a first predetermined result of a logical operation between the core activating pulse and the control signal that controls the precharge and the activation of the sense amplifier to a circuit for precharging the bit lines; and
a second logic gate for supplying, as a sense amplifier-activating signal, an output of a second predetermined result of the logical operation between the core activating pulse and the signal that controls the precharge and the activation of the sense amplifier to the sense amplifier.

15. The semiconductor memory device according to claim 13, further comprising:
a refresh address generator for generating a refresh address signal based on the trigger signal output from the selector circuit;
a first control circuit for generating a predetermined bit signal and an inverted signal of the predetermined bit signal based on a predetermined bit signal of the refresh address signal that is output from the refresh address generator, an output signal from the refresh cycle period-determining circuit, and output signals from the logic gates; and
a second control circuit for controlling activation of the first and second word lines based on, at least, the predetermined bit signal, the inverted signal of the predetermined bit signal, and an address signal corresponding to the first word line.

16. A semiconductor memory device, comprising:
a sense amplifier;
first and second bit lines commonly coupled to said sense amplifier;
first and second memory cells coupled to said first and second bit lines; and respectively, said first and second memory cells that stores and holds one bit data complementarily; wherein
when copying a data stored in one of the first and second memory cells into the other one of the memory cells,
a data in the other one of the memory cells is reset;
after the resetting, a word line connected to the one of the memory cells is activated;
after the activation, the data on the bit line read out from the one of the cells is amplified by said sense amplifier on said first and second bit lines; and
after amplified, the data is stored in the other memory cell.

17. The device according to claim 16, wherein said reset is performed by an operation such that a word line connected to the other one of the memory cells in a precharge period for bit lines.

18. A method of controlling a semiconductor memory device that stores and holds one bit of data complementarily by two memory cells respectively connected to two bit lines, which form a bit line pair, commonly connected to one sense amplifier, the method comprising the steps of:
resetting, when copying a cell data of one of the two memory cells into the other one of the memory cells, a cell data of the other one of the memory cells that is a copy destination; and
activating, after resetting the other one of the memory cells, a word line connected to the one of the memory cells, amplifying by the sense amplifier the data of the one of the memory cells to be output to the bit line pair, and storing the cell data of the one of the memory cells into the other one of the memory cells from the sense amplifier via the bit line pair.

19. The method of controlling a semiconductor memory device according to claim 18, wherein the step of resetting the cell data of the other one of the memory cells comprises a step of writing an intermediate voltage into the other one of the memory cells by activating a word line connected to the other one of the memory cells in a period in which the bit line pair is precharged to a precharge voltage being an intermediate voltage between a high-potential side power supply voltage and a low-potential side power supply voltage.

20. The method of controlling a semiconductor memory device according to claim 19, wherein:
the two memory cells are respectively connected to two word lines;
in a normal mode, the two word lines are assigned separate addresses; and
in a twin cell mode in which one bit of data is complimentarily stored and held by the two memory cells, the two word lines are assigned the same address and are activated with the same timing after a cell data of one of the two memory cells has been copied into the other one of the memory cells.

21. The method of controlling a semiconductor memory device according to claim 20, wherein the copy operation of a data of one of the two memory cells into the other one of the memory cells is performed based on a trigger signal for instructing a refresh operation of dynamic type memory cells.

* * * * *